(12) United States Patent
Milshtein et al.

(10) Patent No.: US 11,635,700 B2
(45) Date of Patent: Apr. 25, 2023

(54) METHOD AND APPARATUS FOR EUV MASK INSPECTION

(71) Applicant: KLA Corporation, Milpitas, CA (US)

(72) Inventors: Erel Milshtein, Cupertino, CA (US); Alexander Bykanov, Milpitas, CA (US); Konstantin Tsigutkin, Milpitas, CA (US); Lauren Wilson, Milpitas, CA (US); Lubomyr Kucher, Milpitas, CA (US); Brian Ahr, Milpitas, CA (US); Maksim Alexandrovich Deminskii, Moscow (RU); Leonid Borisovich Zvedenuk, Moscow (RU); Aleksandr Vladimirovich Lebedev, Moscow (RU); Andrey Evgenievich Stepanov, Moscow (RU)

( * ) Notice: Subject to any disclaimer, the term of this patent is extended or adjusted under 35 U.S.C. 154(b) by 0 days.

(21) Appl. No.: 17/210,185

(22) Filed: Mar. 23, 2021

(65) Prior Publication Data
US 2022/0260928 A1    Aug. 18, 2022

Related U.S. Application Data

(60) Provisional application No. 63/150,091, filed on Feb. 17, 2021.

(51) Int. Cl.
G03F 7/20    (2006.01)

(52) U.S. Cl.
CPC ...... *G03F 7/70608* (2013.01); *G03F 7/70033* (2013.01)

(58) Field of Classification Search
CPC ............ G03F 7/70608; G03F 7/70033; G03F 7/70933; G03F 7/70916; G03F 7/70058; G03F 7/70175
See application file for complete search history.

(56) References Cited

U.S. PATENT DOCUMENTS

| | | | |
|---|---|---|---|
| 7,812,329 B2 | 10/2010 | Bykanov et al. | |
| 9,420,678 B2 | 8/2016 | Bykanov et al. | |
| 10,034,362 B2 | 7/2018 | Kuritsyn et al. | |
| 2009/0090877 A1* | 4/2009 | Van Empel | H05G 2/008 250/504 R |
| 2016/0252821 A1* | 9/2016 | De Jong | G03F 7/70175 355/71 |
| 2018/0246422 A1 | 8/2018 | Mulder et al. | |
| 2020/0008290 A1 | 1/2020 | Su et al. | |

OTHER PUBLICATIONS

WIPO, ISR for International Application No. PCT/US2022/015541, May 20, 2022.

* cited by examiner

*Primary Examiner* — Mesfin T Asfaw
(74) *Attorney, Agent, or Firm* — Hodgson Russ LLP

(57) ABSTRACT

A method for producing a protective buffer flow in an EUV light source and an EUV mask inspection apparatus are provided. The method includes directing light along a light path from the EUV light source toward a collector. A first buffer gas from a buffer gas injector is injected through a plurality of through holes in the collector. The first buffer gas is directed away from a surface of the collector. A second buffer gas is injected from a ring manifold arranged peripherally to the collector and arranged a first distance toward the light path in relation to the collector. The second buffer gas is directed away from the surface of the collector. The first distance corresponds to a distance from the collector where the first buffer gas merges into a single flow.

19 Claims, 8 Drawing Sheets

METHOD AND APPARATUS FOR EUV MASK INSPECTION

CROSS-REFERENCE TO RELATED APPLICATIONS

This application claims priority to the provisional patent application filed Feb. 17, 2021 and assigned U.S. App. No. 63/150,091, the disclosure of which is hereby incorporated by reference.

FIELD OF THE DISCLOSURE

This disclosure relates to optical systems and, more particularly, optical systems for semiconductor inspection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Certain inspection processes for the inspection of photomasks operate using extreme ultraviolet (EUV) light. The use of EUV light presents many challenges to the optical system. For example, the optical system may rely on an EUV light source, which can use or include tin (Sn), to generate plasma. While the plasma is generated the Sn transforms from solid or liquid state into ionized gas. Being metallic, Sn condenses in the form of small particles or metallic coating on any components in proximity to the plasma. These particles and coating damage the optical components by reducing their transmission and reflectivity as well as increase of surface roughness.

Therefore, what is needed is an EUV mask inspection apparatus that protects the optical components from damage from contaminants.

BRIEF SUMMARY OF THE DISCLOSURE

An embodiment of the present disclosure provides a method for producing a protective buffer flow in an EUV light source. The method may comprise: directing light along a light path from the EUV light source toward a collector; injecting a first buffer gas from a buffer gas injector through a plurality of through holes in the collector, wherein the first buffer gas is directed away from a surface of the collector; and injecting a second buffer gas from a ring manifold arranged peripherally to the collector and arranged a first distance toward the light path in relation to the collector, wherein the second buffer gas is directed away from the surface of the collector. The first distance may correspond to a distance from the collector where the first buffer gas merges into a single flow.

According to an embodiment of the present disclosure, a rate of injecting the second buffer gas may be larger than a rate of injecting the first buffer gas.

According to an embodiment of the present disclosure, the first buffer gas and the second buffer gas may be the same. The first buffer gas and the second buffer gas may each comprise argon, helium, hydrogen, nitrogen, neon, krypton, or xenon.

According to an embodiment of the present disclosure, the plurality of through holes in the collector may be arranged about the surface of the collector, and may be spaced apart such that there is a distance of between 1 mm and 50 mm between adjacent through holes.

According to an embodiment of the present disclosure, the ring manifold may comprise a plurality of buffer gas injectors arranged circularly about the ring manifold, and the plurality of buffer gas injectors may be spaced apart such that there is a distance of between 1 mm and 50 mm between adjacent buffer gas injectors.

According to an embodiment of the present disclosure, the first buffer gas and the second buffer gas may be directed toward the light path upstream from the collector.

According to an embodiment of the present disclosure, the method may include injecting a third buffer gas from a second ring manifold arranged peripherally to the ring manifold and arranged a second distance toward the light path in relation to the ring manifold, wherein the third buffer gas is directed away from the surface of the collector. The second distance may correspond to a distance from the ring manifold where the second buffer gas merges into a single flow.

According to an embodiment of the present disclosure, the collector may be a mirror.

An embodiment of the present disclosure provides a EUV mask inspection apparatus. The apparatus may comprise: an EUV light source configured to emit EUV light along a light path; a collector arranged in the light path; a buffer gas injector configured to inject a first buffer gas through a plurality of through holes in the collector, wherein the first buffer gas is directed away from a surface of the collector; and a ring manifold configured to inject a second buffer gas, arranged peripherally to the collector and arranged a first distance toward the light path in relation to the collector, wherein the second buffer gas is directed away from the surface of the collector. The first distance may correspond to a distance from the collector where the first buffer gas merges into a single flow.

According to an embodiment of the present disclosure, a rate of injecting the second buffer gas may be larger than a rate of injecting the first buffer gas.

According to an embodiment of the present disclosure, the first buffer gas and the second buffer gas may be the same. The first buffer gas and the second buffer gas may each comprise argon, helium, hydrogen, nitrogen, neon, krypton, or xenon.

According to an embodiment of the present disclosure, the plurality of through holes in the collector may be arranged about the surface of the collector, and may be spaced apart such that there is a distance of between 1 mm and 50 mm between adjacent through holes.

According to an embodiment of the present disclosure, the ring manifold may comprise a plurality of buffer gas injectors arranged circularly about the ring manifold, and the plurality of buffer gas injectors may be spaced apart such that there is a maximum distance of between 1 mm and 50 mm between adjacent buffer gas injectors.

According to an embodiment of the present disclosure, the apparatus may further comprise a protective skirt arranged peripherally to the ring manifold that extends a second distance toward the light path. The second distance may correspond to a distance from the ring manifold where the second buffer gas merges into a single flow.

According to an embodiment of the present disclosure, the apparatus may further comprise a second ring manifold configured to inject a third buffer gas, arranged peripherally to the ring manifold and arranged a second distance toward the light path in relation to the ring manifold, wherein the third buffer gas is directed away from the surface of the collector. The second distance may correspond to a distance from the ring manifold where the second buffer gas merges into a single flow.

According to an embodiment of the present disclosure, the collector may be a mirror.

According to an embodiment of the present disclosure, the ring manifold may be sealed to the collector.

According to an embodiment of the present disclosure, there may be a gap between the ring manifold and the collector. The apparatus may further comprise: a first wall on the collector extending away from the light path; and a second wall on the ring manifold extending away from the light path. The first wall and the second wall may be separated by the gap.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
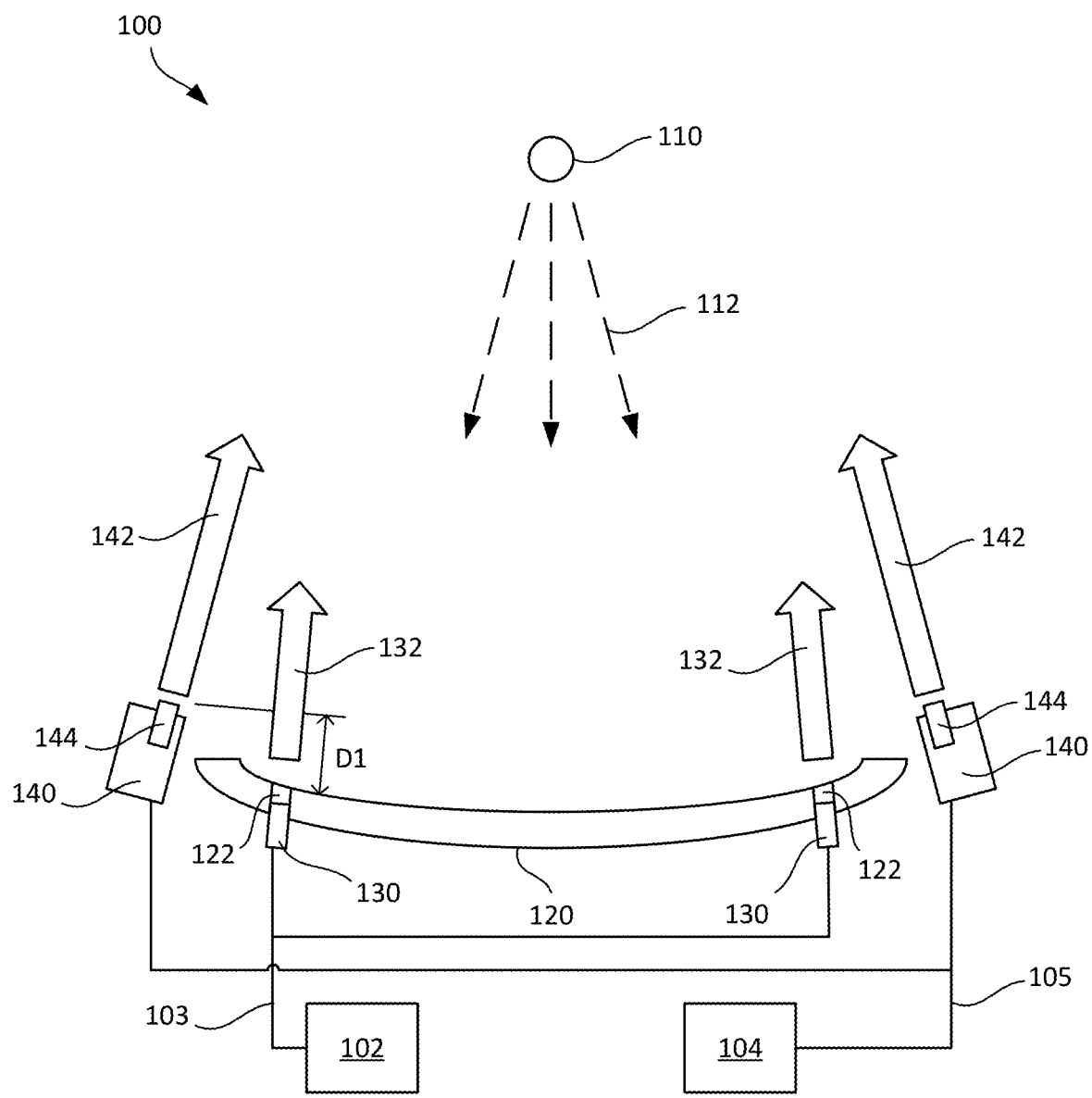
FIG. 1 is a schematic diagram of an EUV mask inspection apparatus according to an embodiment of the present disclosure.

An embodiment of the present disclosure provides an EUV mask inspection apparatus 100. As shown in FIG. 1, the apparatus 100 may comprise a EUV light source 110. The EUV light source 110 may be configured to emit EUV light. For example, the EUV light source 110 may utilize tin (Sn), xenon (Xe), or lithium (Li) as a plasma media. When plasma is generated at the EUV light source 110, the plasma media transforms from solid or liquid state into ionized gas. Plasma can be generated by discharge produced plasma (DPP) or laser produced plasma (LPP). The EUV light may be emitted along a light path 112. There may be one or more optical components along the light path 112.

The apparatus 100 may further comprise a collector 120 arranged in the light path 112. The collector 120 may be configured to redirect EUV light from the EUV light source 110. For example, the collector 120 may be a mirror. The mirror may be a 2D or 3D shape. For example, the mirror may be a flat ellipse (2D), a curved ellipse (3D), or an ellipse with a cut-out which is straight or has an arbitrary shape. The collector 120 may having various figure error, surface roughness, and size, depending on the distance of the collector from the EUV light source 110, the focus point where the light converges to, and the amount of power of the system. The collector 120 may be curved. For example, the collector 120 may be concave or convex. The collector 120, the EUV light source 110, and optical components along the light path 112 can be in vacuum.

Figure 6A:
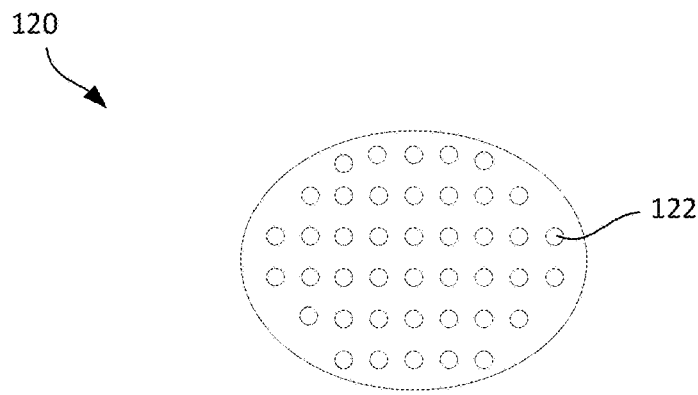
FIG. 6A is a top view of a collector of an EUV mask inspection apparatus according to an embodiment of the present disclosure.
Figure 7:
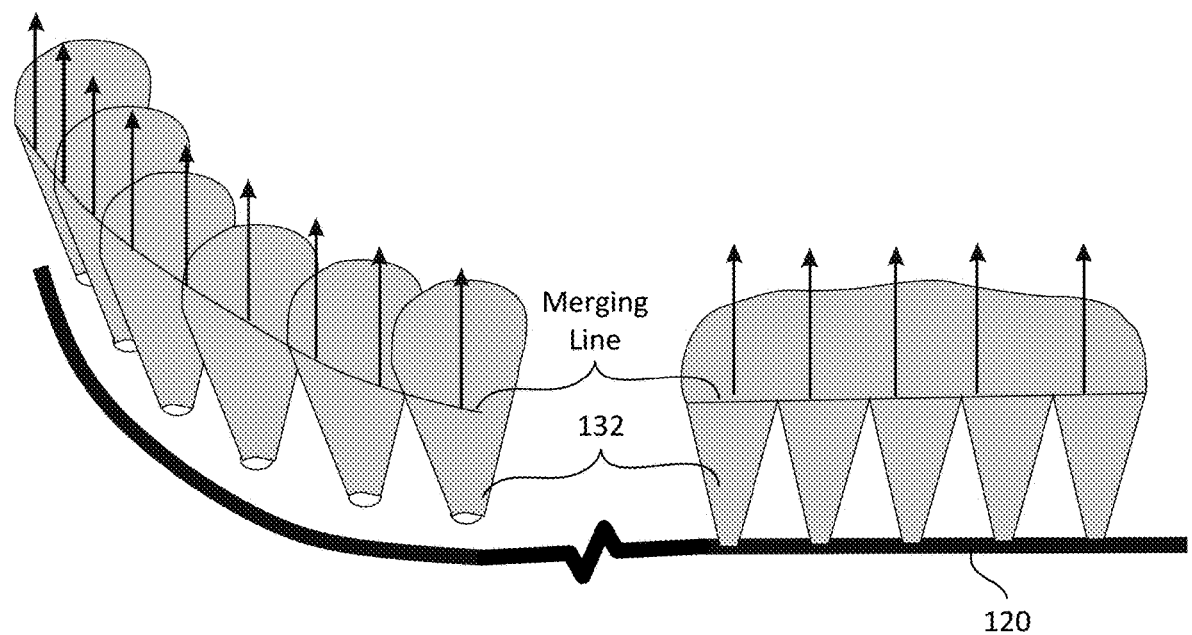
FIG. 7 is a flow chart of a method for producing a protective buffer flow in an EUV light source according to an embodiment of the present disclosure.

The apparatus 100 may further comprise a buffer gas injector 130. The buffer gas injector 130 may be configured to inject a first buffer gas 132 through a plurality of through holes 122 in the collector 120. The first buffer gas 132 may be directed away from a surface of the collector 120. The first buffer gas 132 may be directed toward the light path 112, upstream from the collector 120. The first buffer gas 132 may be supplied from a first gas source 102. The first gas source 102 may be connected to the buffer gas injector 130 by first gas tubing 103. There may be more than one first gas source 102. The first gas source 102 may be a pressurized cylinder or a gas supply from a facility manifold. The plurality of through holes 122 may be arranged about the surface of the collector 120. For example, as shown in FIG. 6A, the plurality of through holes 122 may be spaced apart, covering the surface of the collector 120. The plurality of through holes 122 may be spaced apart such that there is a distance of between 1 mm and 100 mm between adjacent through holes 122. It can be appreciated that when the first buffer gas 132 is injected through a plurality of through holes 122, the individual jets will merge into a single flow at some distance from the collector 120, which may be toward the light path 112. The merging concept may be defined at a certain location in space, known as a merging line, where the angles of the flow from various sources converge to a single angle. For example, as shown in FIG. 7, the merging line may be defined at a distance from the collector 120, where the individual flows of the first buffer gas 132 merge into a single flow. As such, in the area between the flow sources and the merging line, the individual flows are separated, which may allow contaminants to penetrate between the individual flows. However, in the area beyond the merging line, the individual flows combine to a single flow, which forms a protective barrier and prevents most or all contaminants from penetrating the flow. For example, more than 80%, more than 90%, more than 95%, or more than 99% of contaminants can be blocked beyond the merging line.

The apparatus 100 may further comprise a ring manifold 140. The ring manifold 140 may have an annular shape. For example, the ring manifold 140 may be an annular ellipse, and annular circle, or any other annular shape. The ring manifold 140 may be configured to inject a second buffer gas 142 directed away from the surface of the collector 120. The second buffer gas 142 may be directed toward the light path 112, upstream from the collector 120. The second buffer gas 142 may be supplied from a second gas source 104. The second gas source 104 may be a pressurized cylinder or a gas supply from a facility manifold. The second gas source 104 may be connected to the ring manifold 140 by second gas tubing 105. There may be more than one second gas source 104. The ring manifold 140 may be arranged peripherally to the collector 120. For example, the ring manifold 140 may be arranged radially outward from the collector 120. The ring manifold 140 may be arranged a first distance D1 toward the light path 112 in relation to the collector 120. The first distance D1 may correspond to a distance from the collector 120 where the first buffer gas 132 merges into a single flow. For example, the first distance D1 may be between 1 mm and 20 mm. In a particular embodiment, the first distance D1 may be 5 mm. It can be appreciated that the when the ring manifold 140 is arranged the first distance D1 toward the light path 112 in relation to the collector 120, contaminants in the vicinity of the collector 120 may be less likely to penetrate the first buffer gas 132 and reach the collector 120 due to the second buffer gas 142. The contaminants can be Sn or other materials from the plasma media, but can be other particles or materials such as hydrocarbons. The contaminants may between 1 nm and 50 nm in size.

Figure 6B:
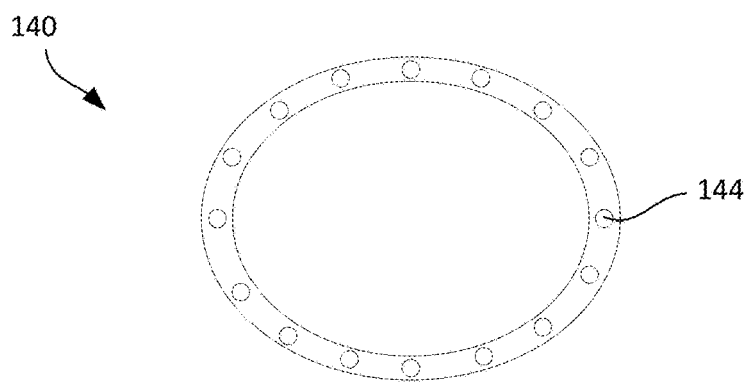
FIG. 6B is a top view of a ring manifold of an EUV mask inspection apparatus according to an embodiment of the present disclosure.

The ring manifold 140 may comprise a plurality of buffer gas injectors 144 arranged circularly about the ring manifold 140. For example, as shown in FIG. 6B, the plurality of buffer gas injectors 144 may be arranged in an ellipse, at a top surface of the ring manifold 140. The plurality of buffer gas injectors 144 may be spaced apart such that there is a distance of between 1 mm and 50 mm between adjacent buffer gas injectors 144. It can be appreciated that when the second buffer gas 142 is injected from the plurality of buffer gas injectors 144, the individual jets will merge into a single flow at some distance from the ring manifold 140 toward the light path 112.

The first buffer gas 132 and the second buffer gas 142 may define a protective buffer flow surrounding the light path 112. For example, the first buffer gas 132 may protect the center of the collector 120, and the second buffer gas 142 may protect the edges of the collector 120. In this way, the collector 120 may be protected from contaminants in the inspection system and from plasma generated by the EUV light source 110.

The first buffer gas 132 and the second buffer gas 142 may be injected into the system at different rates. For example, a ratio between the rate of the second buffer gas 142 to the first buffer gas 132 may be between 10:1 and 1:10. In a particular embodiment, a ratio between the rate of the second buffer gas 142 and the first buffer gas 132 may be 3:1. It can be appreciated that a larger flow rate may be desirable to improve the protective effect of the first buffer gas 132 and the second buffer gas 142. However, the flow rate of the first buffer gas 132 may be limited due to the size of the plurality of through holes 122 in the collector 120, compared to the possible flow rate of the second buffer gas 142 from the ring manifold 140. In addition, the risk of contamination from convection at the edges of the collector 120 may be greater than the risk of contamination from diffusion at the center of the collector 120. Thus, a flow rate of injecting the second buffer gas 142 may be larger than a rate of injecting the first buffer gas 132. This may improve the protective effect of the protective buffer flow compared to an inspection system which only injects the first buffer gas 132.

The first buffer gas 132 and the second buffer gas 142 may be the same. For example, the first buffer gas 132 and the second buffer gas 142 may be argon, helium, hydrogen, nitrogen, neon, krypton, xenon or a mixture thereof. Alternatively, the first buffer gas 132 and the second buffer gas 142 may be different species or mixtures. While a first gas source 102 and second gas source 104 are illustrated, one gas source may be used if the first buffer gas 132 and the second buffer gas 142 are the same. The gas sources may have a pressure from 10 Pa to 10000 Pa. In a particular embodiment, the gas sources may have a pressure of about 1000 Pa.

Figure 2:
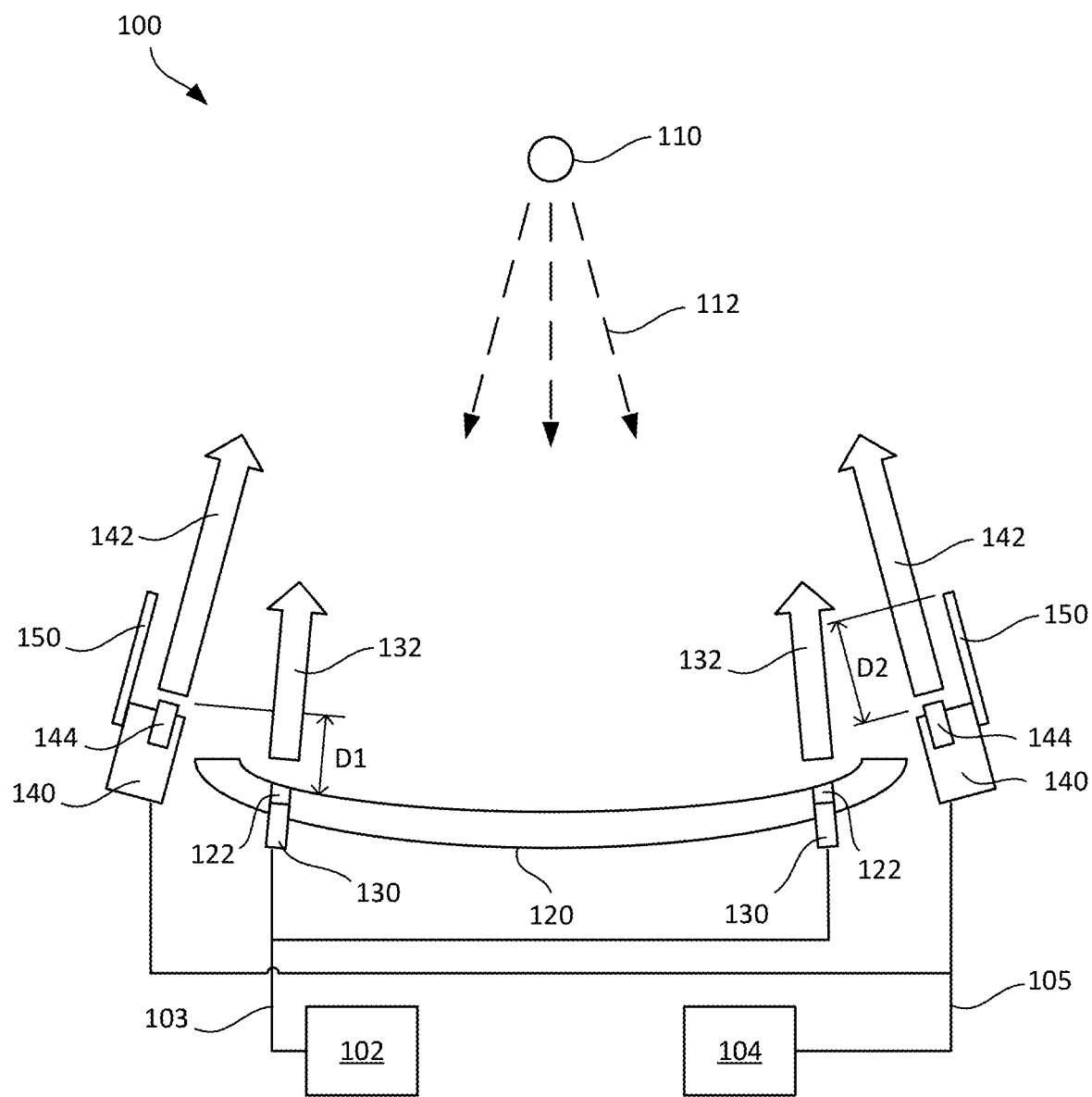
FIG. 2 is a schematic diagram of an EUV mask inspection apparatus according to another embodiment of the present disclosure.

As shown in FIG. 2, the apparatus 100 may further comprise a protective skirt 150. The protective skirt 150 may have an annular shape. The protective skirt 150 may be arranged peripherally to the ring manifold 140. For example, the protective skirt 150 may be disposed on an outer surface of the ring manifold 140. The protective skirt 150 may be secured to the ring manifold 140 using welds, fasteners, or adhesive. Alternatively, the protective skirt 150 may be an integrated portion of the ring manifold 140. The protective skirt 150 may extend a second distance D2 toward the light path 112, upstream from the collector 120. The second distance D2 may correspond to a distance from the ring manifold 140 where the second buffer gas 142 merges into a single flow. For example, the second distance D2 may be between 1 mm and 20 mm. In a particular embodiment, the second distance D2 may be 5 mm. It can be appreciated that the when the protective skirt 150 extends the second distance D2 toward the light path 112 in relation to the ring manifold 140, contaminants in the vicinity of the collector 120 may be less likely to penetrate the second buffer gas 142 (and the first buffer gas 132) and reach the collector 120.

Plasma media mass concentration (PMMC) on the optical components to be protected may be used as an indication of the effectiveness of the protective buffer flow. Based on computational fluid dynamics (CFD) modeling and other methods, the improvement via reduction of PMMC may be computed. In a tested example, PMMC was computed on the collector 120 using various designs of the present disclosure. The test results are shown in Table 1.

TABLE 1

| Apparatus Design | Average PMMC | Max PMMC |
|---|---|---|
| First buffer gas only (baseline) | 8.0E11 | 1.0E13 |
| First buffer gas and second buffer gas (FIG. 1) | 6.0E8 | 2.0E10 |
| First buffer gas and second buffer gas with protective skirt (FIG. 2) | 5.0E7 | 2.5E8 |

According to the test results, protection of the collector 120 may be improved by adding the ring manifold 140 and the second buffer gas 142. Protection of the collector 120 may be further improved by adding the protective skirt 150 to the ring manifold 140.

Figure 3:
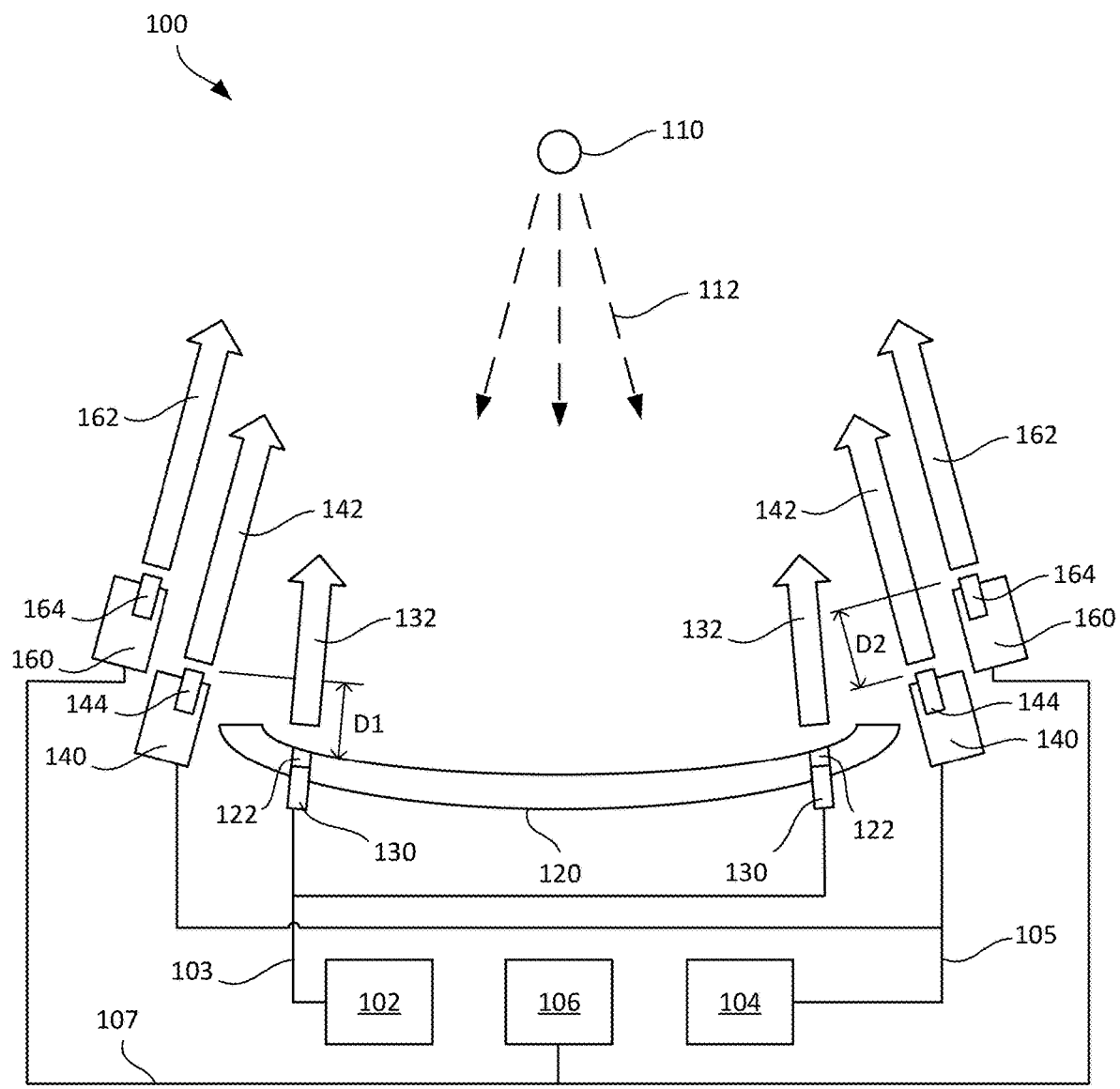
FIG. 3 is a schematic diagram of an EUV mask inspection apparatus according to another embodiment of the present disclosure.

As shown in FIG. 3, the apparatus 100 may further comprise a secondary ring manifold 160. The secondary ring manifold 160 may have an annular shape. For example, the secondary ring manifold 160 may be an annular ellipse, and annular circle, or any other annular shape. The secondary ring manifold 160 may be configured to inject a third buffer gas 162 directed away from the surface of the collector. The third buffer gas 162 may be directed toward the light path 112, upstream from the collector 120. The third buffer gas 162 may be supplied from a third gas source 106. The third gas source 106 may be a pressurized cylinder or a gas supply from a facility manifold. The third gas source 106 may be connected to the secondary ring manifold 160 by third gas tubing 107. There may be more than one third gas source 106. The secondary ring manifold 160 may be arranged peripherally to the ring manifold 140. For example, the secondary ring manifold 160 may be arranged radially outward from the ring manifold 140. The secondary ring manifold 160 may be arranged a second distance D2 toward the light path 112 in relation to the ring manifold 140. The second distance D2 may correspond to a distance from the ring manifold 140 where the second buffer gas 142 merges into a single flow. For example, the second distance D2 may be between 1 mm and 20 mm. In a particular embodiment, the second distance D2 may be 5 mm. It can be appreciated that the when the secondary ring manifold 160 is arranged the second distance D2 toward the light path 112 in relation to the ring manifold 140, contaminants in the vicinity of the collector 120 may be less likely to penetrate the second buffer gas 142 (and the first buffer gas 132) and reach the collector 120, due to the third buffer gas 162.

The second buffer gas 142 and the third buffer gas 162 may be injected into the system at the same rate. Alternatively, the second buffer gas 142 and the third buffer gas 162 may be injected into the system at different rates. The third buffer gas 162 may be argon, helium, hydrogen, nitrogen, neon, krypton, xenon or a mixture thereof.

Figure 6C:
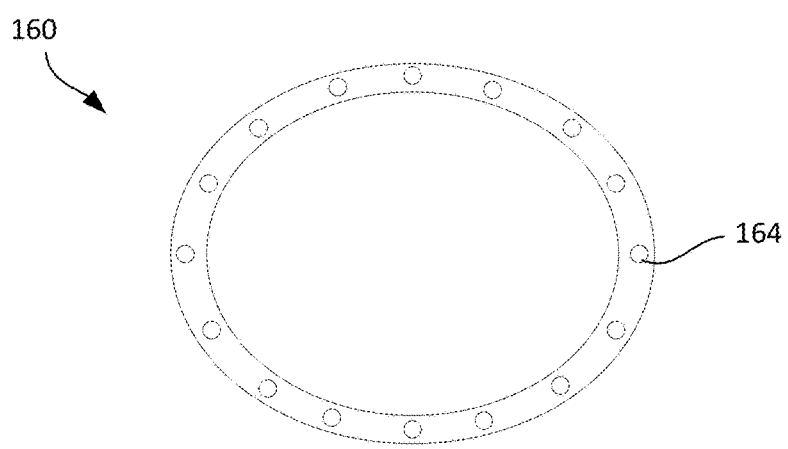
FIG. 6C is a top view of a secondary ring manifold of an EUV mask inspection apparatus according to an embodiment of the present disclosure.

The secondary ring manifold 160 may comprise a plurality of secondary buffer gas injectors 164 arranged circularly about the second ring manifold 160. For example, as shown in FIG. 6C, the plurality of second buffer gas injectors 164 may be arranged in an ellipse, at a top surface of the second ring manifold 160. The plurality of secondary buffer gas injectors 164 may be spaced apart such that there is a maximum distance of between 1 mm and 50 mm between adjacent secondary buffer gas injectors 164. It can be appreciated that when the third buffer gas 162 is injected from the plurality of secondary buffer gas injectors 164, the individual jets will merge into a single flow at some distance from the secondary ring manifold 160 toward the light path 112.

Figure 4:
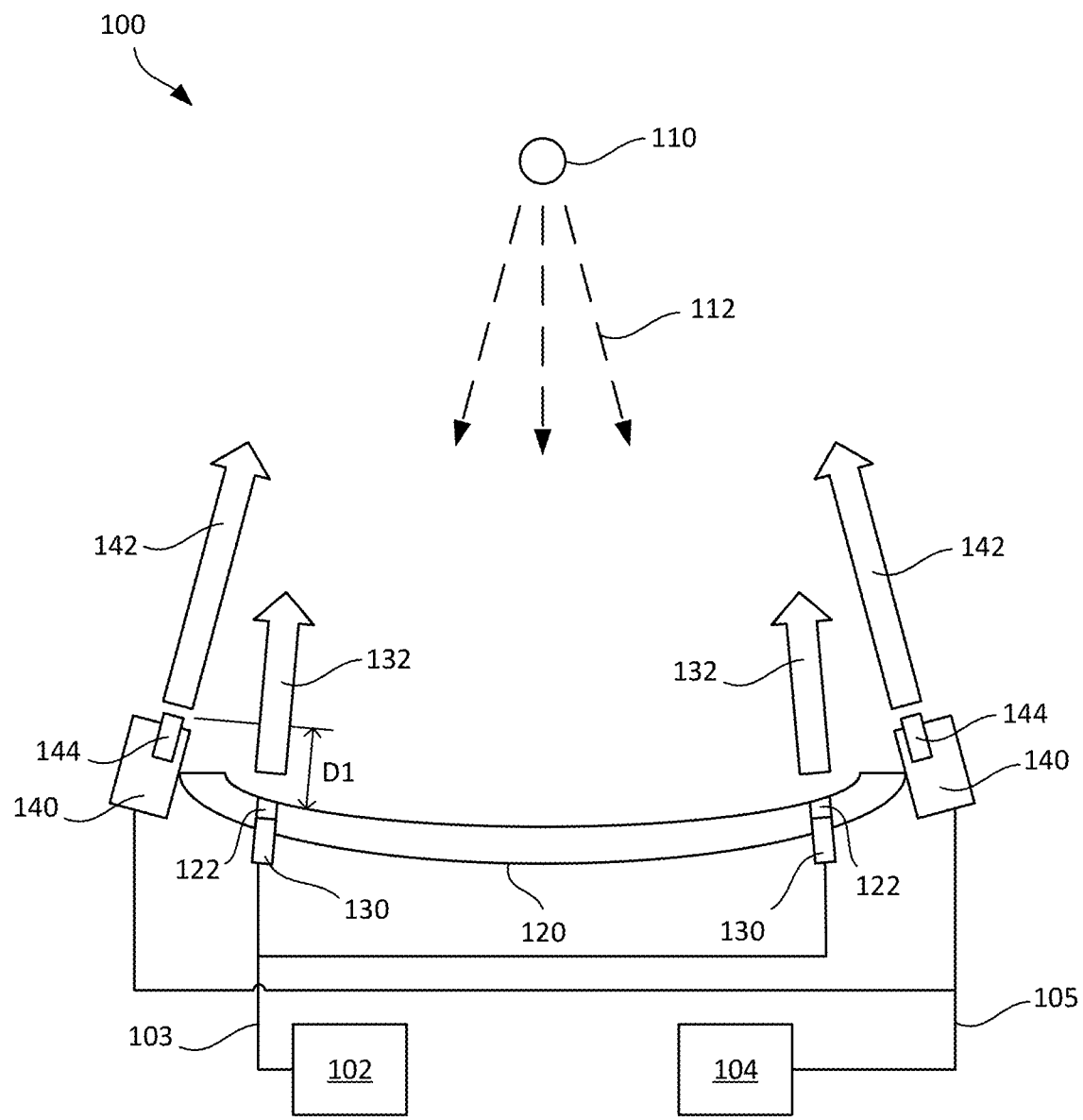
FIG. 4 is a schematic diagram of an EUV mask inspection apparatus according to another embodiment of the present disclosure.

According to an embodiment of the present disclosure, as shown in FIG. 4, the ring manifold 140 may be sealed to the collector 120. For example, the ring manifold 140 may be arranged radially outward from the collector 120, such that there is no gap between the ring manifold 140 and the collector 120. An o-ring, gasket, or any other sealing device may be provided between the ring manifold 140 and the collector 120 to ensure sealing between the ring manifold 140 and the collector 120. The sealing device may be disposed on the ring manifold 140, on the collector 120, or on any other component of the system. The ring manifold 140 may also extend away from the light path 112, such that there is no gap between the ring manifold 140 and the collector 120. Accordingly, the back of the collector 120 may be protected from contaminants.

Figure 5:
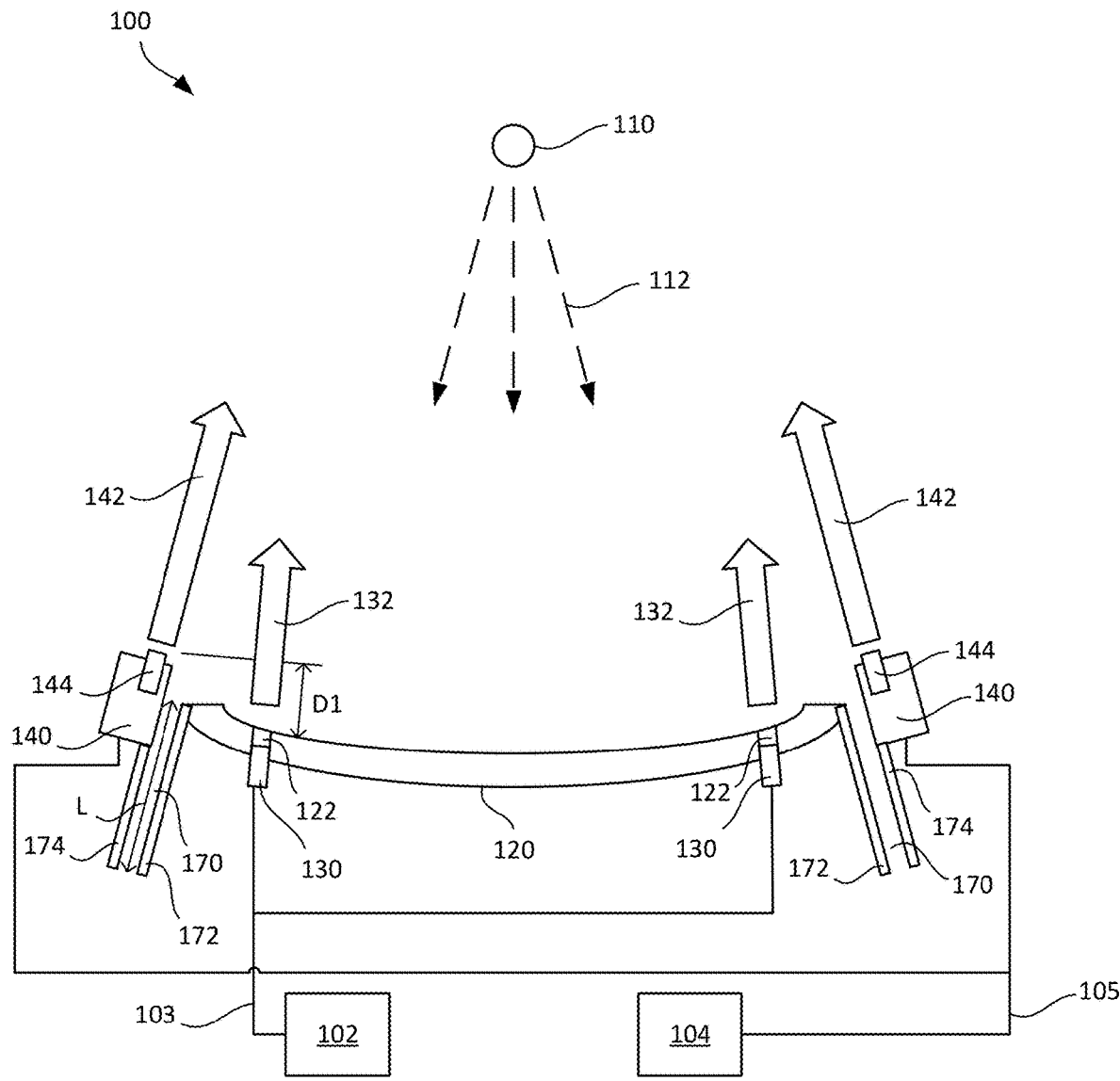
FIG. 5 is a schematic diagram of an EUV mask inspection apparatus according to another embodiment of the present disclosure.

According to an embodiment of the present disclosure, as shown in FIG. 5, there may be a gap 170 between the ring manifold 140 and the collector 120. For example, the ring manifold 140 may be arranged radially outward from the collector 120, such that there is a gap 170 between the ring manifold 140 and the collector 120. With the gap 170, the back of the collector 120 may not be protected from contaminants. However, the apparatus 100 may further comprise a first wall 172 and a second wall 174. The first wall 172 may be disposed on the collector 120, and extend away from the light path 112. The second wall 174 may be disposed on the ring manifold 140, and extend away from the light path 112. The first wall 172 and the second wall 174 may be separated by the gap 170. The first wall 172 and the second wall 174 may extend a distance L away from the collector 120 and the ring manifold 140. It can be appreciated that contaminants that enter the gap 170 may collide with the first wall 172 and the second wall 174, and the back of the collector 120 may be protected. The length L of the gap 170 between the first wall 172 and the second wall 174 may be determined based on a width of the gap 170 and the pressure of the system.

With the EUV mask inspection apparatus 100, inspection performance may be optimized by increasing the light intensity on the reticle as well as the lifetime of the optical collector 120 in proximity to the EUV light source 110 based on the protective buffer flow defined by the first buffer gas 132 and the second buffer gas 142.

Figure 8:
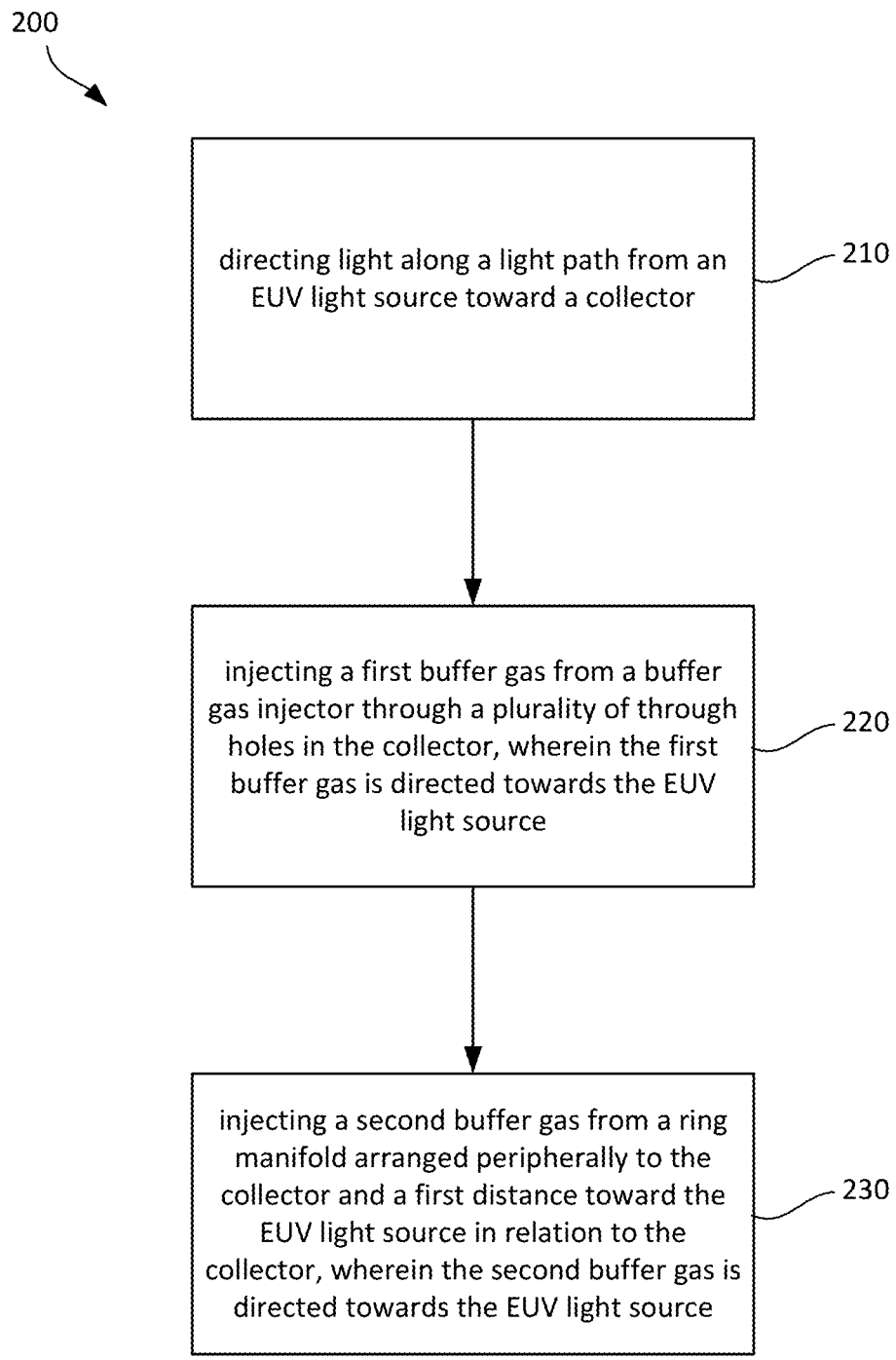
FIG. 8 is a schematic diagram illustrating the concept of individual gas jets merging into a single flow.

An embodiment of the present disclosure may provide a method 200 for producing a protective buffer flow in an EUV light source. As shown in FIG. 8, the method 200 may comprise the following steps.

At step 210, light from the EUV light source is directed toward a collector. The EUV light source may be configured to emit EUV light. For example, the EUV light source may utilize Sn, Xe, or Li as a plasma media or to generate a plasma media. When plasma is generated at the EUV light source, the plasma media transforms from solid or liquid state into ionized gas. Plasma can be generated by DPP or LPP. The EUV light may be emitted along a light path.

At step 220, a first buffer gas is injected from a buffer gas injector through a plurality of through holes in a collector. The collector may be arranged in the light path. The collector may be configured to redirect EUV light from the EUV light source. For example, the collector may be a mirror. The mirror may be a 2D or 3D shape. For example, the mirror may be a flat ellipse (2D), a curved ellipse (3D), or an ellipse with a cut-out which is straight or has an arbitrary shape. The collector may be curved. For example, the collector may be concave or convex. The first buffer gas may be directed away from the surface of the collector. The first buffer gas may be directed toward the light path, upstream from the collector.

The plurality of through holes may be arranged about the surface of the collector. For example, as shown in FIG. 6A, the plurality of through holes may be spaced apart, covering the surface of the collector. The plurality of through holes may be spaced apart such that there is a distance of between 1 mm and 100 mm between adjacent through holes. It can be appreciated that when the first buffer gas is injected through a plurality of through holes, the individual jets will merge into a single flow at some distance from the collector toward the light path.

At step 230, a second buffer gas is injected from a ring manifold arranged peripherally to the collector and arranged a first distance toward the light path in relation to the collector. The second buffer gas may be directed away from the surface of the collector. The second buffer gas may be directed toward the light path, upstream from the collector. The first distance may correspond to a distance from the collector where the first buffer gas merges into a single flow. For example, the first distance may be between 1 mm and 20 mm. In a particular embodiment, the first distance may be 5 mm. It can be appreciated that the when the ring manifold is arranged the first distance toward the light path in relation to the collector, contaminants in the vicinity of the collector may be less likely to penetrate the first buffer gas and reach the collector, due to the second buffer gas. The contaminants can be Sn or other materials from the plasma media, but can be other particles or materials such as hydrocarbons. The contaminants may be between 1 nm and 50 nm in size.

The first buffer gas and the second buffer gas can be directed away from the surface of the collector. The shape of the surface of the collector can affect the direction of the first buffer gas and the second buffer gas, but the through holes in the collector also can affect the direction of the first buffer gas and the second buffer gas. The first buffer gas and the second buffer gas may be angled relative to one another for convergent or divergent flows. For example, the angle between the first buffer gas and the second buffer gas may be between −45 degrees and 45 degrees. In a particular embodiment, the angle between the first buffer gas and the second buffer gas may be 0 degrees (i.e., the first buffer gas and the second buffer gas are parallel).

The ring manifold may comprise a plurality of buffer gas injectors arranged circularly about the ring manifold. For example, as shown in FIG. 6B, the plurality of buffer gas injectors may be arranged in an ellipse, at a top surface of the ring manifold. The plurality of buffer gas injectors may be spaced apart such that there is a maximum distance of between 1 mm and 50 mm between adjacent buffer gas injectors. It can be appreciated that when the second buffer gas is injected from the plurality of buffer gas injectors, the individual jets will merge into a single flow at some distance from the ring manifold toward the light path.

The first buffer gas and the second buffer gas may define a protective buffer flow surrounding the light path. For example, the first buffer gas may protect the center of the collector, and the second buffer gas may protect the edges of the collector. In this way, the collector may be protected from contaminants in the inspection system and from plasma generated by the EUV light source.

The first buffer gas and the second buffer gas may be injected into the system at different rates. For example, a ratio between the rate of the second buffer gas to the rate of the first buffer gas may be between 10:1 and 1:10. In a particular embodiment, a ratio between the rate of the second buffer gas and the first buffer gas may be 3:1. It can be appreciated that a larger flow rate may be desirable to improve the protective effect of the first buffer gas and the second buffer gas. However, the flow rate of the first buffer gas may be limited due to the size of the plurality of through holes in the collector, compared to the possible flow rate of the second buffer gas from the ring manifold. In addition, the risk of contamination from convection at the edges of the collector may be greater than the risk of contamination from diffusion at the center of the collector. Thus, a flow rate of injecting the second buffer gas may be larger than a rate of injecting the first buffer gas. This may improve the protective effect of the protective buffer flow compared to an inspection system which only injects the first buffer gas.

The first buffer gas and the second buffer gas may be the same. For example, the first buffer gas and the second buffer gas may be argon, helium, hydrogen, nitrogen, neon, krypton, xenon, or a mixture thereof. Alternatively, the first buffer gas and the second buffer gas may be different species or mixtures.

The method 200 may further comprise: providing a protective skirt arranged peripherally to the ring manifold that extends a second distance toward the light path, upstream from the collector. The protective skirt may be disposed on an outer surface of the ring manifold. The protective skirt may be secured to the ring manifold using welds, fasteners, or adhesive. Alternatively, the protective skirt may be an integrated portion of the ring manifold. The second distance may correspond to a distance from the ring manifold where the second buffer gas merges into a single flow. For example, the second distance may be between 1 mm and 20 mm. In a particular embodiment, the second distance may be 5 mm. It can be appreciated that the when the protective skirt extends the second distance toward the light path in relation to the ring manifold, contaminants in the vicinity of the collector may be less likely to penetrate the second buffer gas (and the first buffer gas) and reach the collector.

The method 200 may further comprise: injecting a third buffer gas from a second ring manifold arranged peripherally to the ring manifold and arranged a second distance toward the light path in relation to the ring manifold. The third buffer gas may be directed away from the surface of the collector. The third buffer gas may be directed toward the light path, upstream from the collector. The second distance may correspond to a distance from the ring manifold where the second buffer gas merges into a single flow. For example, the second distance may be between 1 mm and 20 mm. In a particular embodiment, the second distance may be 5 mm. It can be appreciated that the when the second ring manifold is arranged the second distance toward the light path in relation to the ring manifold, contaminants in the vicinity of the collector may be less likely to penetrate the second buffer gas (and the first buffer gas) and reach the collector, due to the third buffer gas.

The second buffer gas and the third buffer gas may be injected into the system at the same rate. Alternatively, the second buffer gas and the third buffer gas may be injected into the system at different rates. The third buffer gas may be argon, helium, hydrogen, nitrogen, neon, krypton, xenon or a mixture thereof.

According to an embodiment of the present disclosure, the ring manifold may be sealed to the collector. For example, the ring manifold may be arranged radially outward from the collector, such that there is no gap between the ring manifold and the collector. The ring manifold may also extend away from the light path, such that there is no gap between the ring manifold and the collector. Accordingly, the method 200 may protect the back of the collector from contaminants.

According to an embodiment of the present disclosure, there may be a gap between the ring manifold and the collector. For example, the ring manifold may be arranged radially outward from the collector, such that there is a gap between the ring manifold and the collector. With the gap, the back of the collector may not be protected from contaminants. However, the method 200 may further comprise: providing a first wall on the collector extending away from the light path; and providing a second wall on the ring manifold extending away from the light path. The first wall and the second wall may be separated by the gap.

The first wall and the second wall may extend a distance away from the collector and the ring manifold. It can be appreciated that contaminants that enter the gap may collide with the first wall and the second wall, and the back of the collector may be protected. The length of the gap between the first wall and the second wall may be determined based on a width of the gap and the pressure of the system.

With the method 200 for producing a protective buffer flow in an EUV light source, inspection performance may be optimized by increasing the light intensity on the reticle as well as the lifetime of the optical collector in proximity to the EUV light source based on the protective buffer flow defined by the first buffer gas and the second buffer gas.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method for producing a protective buffer flow in an EUV light source, comprising:
    directing light along a light path from the EUV light source toward a collector;
    injecting a first buffer gas from a buffer gas injector through a plurality of through holes in the collector, wherein the first buffer gas is directed away from a surface of the collector; and
    injecting a second buffer gas from a manifold buffer gas injector in a ring manifold arranged peripherally to the collector such that there is a gap between the ring manifold and the collector and arranged a first distance toward the light path in relation to the collector, wherein the manifold buffer gas injector faces away from the surface of the collector, wherein the second buffer gas is directed away from the surface of the collector and is directed farther from the surface of the collector than the first distance, wherein there is a first wall on the collector extending away from the light path and a second wall on the ring manifold extending away from the light path, and wherein the first wall and the second wall are separated by the gap;
    wherein the first distance corresponds to a distance from the collector where the first buffer gas merges into a single flow.

2. The method of claim 1, wherein a rate of injecting the second buffer gas is larger than a rate of injecting the first buffer gas.

3. The method of claim 1, wherein the first buffer gas and the second buffer gas are the same.

4. The method of claim 3, wherein the first buffer gas and the second buffer gas each comprise argon, helium, hydrogen, nitrogen, neon, krypton, or xenon.

5. The method of claim 1, wherein the plurality of through holes in the collector are arranged about the surface of the collector, and are spaced apart such that there is a distance of between 1 mm and 50 mm between adjacent through holes.

6. The method of claim 1, wherein the ring manifold comprises a plurality of buffer gas injectors arranged about the ring manifold, and the plurality of buffer gas injectors are spaced apart such that there is a distance of between 1 mm and 50 mm between adjacent buffer gas injectors.

7. The method of claim 1, wherein the first buffer gas and the second buffer gas are directed toward the light path upstream from the collector.

8. The method of claim 1, further comprising:
    injecting a third buffer gas from a second ring manifold arranged peripherally to the ring manifold and arranged a second distance toward the light path in relation to the ring manifold, wherein the third buffer gas is directed away from the surface of the collector;
    wherein the second distance corresponds to a distance from the ring manifold where the second buffer gas merges into a single flow.

9. The method of claim 1, wherein the collector is a mirror.

10. An EUV mask inspection apparatus comprising:
    an EUV light source configured to emit EUV light along a light path;
    a collector arranged in the light path;
    a buffer gas injector configured to inject a first buffer gas through a plurality of through holes in the collector, wherein the first buffer gas is directed away from a surface of the collector;
    a ring manifold that includes a manifold buffer gas injector configured to inject a second buffer gas, arranged peripherally to the collector such that there is a gap between the ring manifold and the collector and arranged a first distance toward the light path in relation to the collector, wherein the manifold buffer gas injector faces away from the surface of the collector, and wherein the second buffer gas is directed away from the surface of the collector and is directed farther from the surface of the collector than the first distance;
    a first wall on the collector extending away from the light path; and
    a second wall on the ring manifold extending away from the light path, wherein the first wall and the second wall are separated by the gap;
    wherein the first distance corresponds to a distance from the collector where the first buffer gas merges into a single flow.

11. The apparatus of claim 10, wherein a rate of injecting the second buffer gas is larger than a rate of injecting the first buffer gas.

12. The apparatus of claim 10, wherein the first buffer gas and the second buffer gas are the same.

13. The apparatus of claim 12, wherein the first buffer gas and the second buffer gas each comprise argon, helium, hydrogen, nitrogen, neon, krypton, or xenon.

14. The apparatus of claim 10, wherein the plurality of through holes in the collector are arranged about the surface of the collector, and are spaced apart such that there is a distance of between 1 mm and 50 mm between adjacent through holes.

15. The apparatus of claim 10, wherein the ring manifold comprises a plurality of buffer gas injectors arranged about the ring manifold, and the plurality of buffer gas injectors are spaced apart such that there is a maximum distance of between 1 mm and 50 mm between adjacent buffer gas injectors.

16. The apparatus of claim 10, further comprising:
a protective skirt arranged peripherally to the ring manifold that extends a second distance toward the light path;
wherein the second distance corresponds to a distance from the ring manifold where the second buffer gas merges into a single flow.

17. The apparatus of claim 10, further comprising:
a second ring manifold configured to inject a third buffer gas, arranged peripherally to the ring manifold and arranged a second distance toward the light path in relation to the ring manifold, wherein the third buffer gas is directed away from the surface of the collector;
wherein the second distance corresponds to a distance from the ring manifold where the second buffer gas merges into a single flow.

18. The apparatus of claim 10, wherein the collector is a mirror.

19. The apparatus of claim 10, wherein the ring manifold is sealed to the collector.

* * * * *